(12) United States Patent
Shinkai

(10) Patent No.: US 7,351,649 B2
(45) Date of Patent: Apr. 1, 2008

(54) RECORDING HEAD UNIT AND METHOD OF PRODUCING THE SAME

(75) Inventor: Yuji Shinkai, Handa (JP)

(73) Assignee: Brother Kogyo Kabushiki Kaisha, Nagoya-Shi (JP)

( * ) Notice: Subject to any disclaimer, the term of this patent is extended or adjusted under 35 U.S.C. 154(b) by 334 days.

(21) Appl. No.: 11/111,069

(22) Filed: Apr. 21, 2005

(65) Prior Publication Data
US 2005/0239233 A1    Oct. 27, 2005

(30) Foreign Application Priority Data
Apr. 22, 2004    (JP) .............................. 2004-126380

(51) Int. Cl.
| | |
|---|---|
| H01L 21/44 | (2006.01) |
| H01L 23/52 | (2006.01) |
| H01L 23/48 | (2006.01) |
| H01L 29/40 | (2006.01) |
| H01L 23/485 | (2006.01) |
| B41J 2/14 | (2006.01) |

(52) U.S. Cl. ...................... 438/612; 438/613; 257/737; 257/779; 257/E23.021; 347/50

(58) Field of Classification Search ................ 438/108, 438/612–613; 257/737–738, 778–780, 789, 257/E23.021, E23.069; 347/50, 72
See application file for complete search history.

(56) References Cited

U.S. PATENT DOCUMENTS

| | | | | | |
|---|---|---|---|---|---|
| 5,929,881 | A | * | 7/1999 | Kitahara et al. ............... | 347/70 |
| 6,142,609 | A | * | 11/2000 | Aoki ............................ | 347/50 |
| 6,332,669 | B1 | * | 12/2001 | Kato et al. ..................... | 347/54 |
| 6,688,732 | B2 | * | 2/2004 | Mitsuhashi et al. ........... | 347/70 |
| 6,979,074 | B2 | * | 12/2005 | Watanabe et al. ............. | 347/50 |
| 7,055,936 | B2 | * | 6/2006 | Imai et al. ..................... | 347/58 |
| 2003/0112298 | A1 | | 6/2003 | Sato et al. | |

FOREIGN PATENT DOCUMENTS

JP        A-2003-69103        3/2003

* cited by examiner

*Primary Examiner*—Luan Thai
(74) *Attorney, Agent, or Firm*—Day Pitney LLP

(57) ABSTRACT

A method of producing a recording head unit including: (A) a recording head including: a plurality of recording elements; and an actuator unit including a plurality of individual electrodes which respectively correspond to the recording elements; and (B) a printed wiring board which includes conductive leads respectively having terminal portions, which is electrically connected to the individual electrodes, and through which an operating signal for operating the recording elements is supplied to the individual electrodes, the method including: forming a plurality of conductive bumps on a surface of the actuator unit such that the bumps protrude from the surface of the actuator unit, so as to be electrically connected to the individual electrodes, respectively; coating a surface of the printed wiring board with an uncured synthetic resin to form an uncured synthetic-resin layer covering the conductive leads of the printed wiring board; bringing the bumps and the terminal portions of the conductive leads into contact with one another by pressing the bumps onto the uncured synthetic-resin layer such that the bumps penetrate the uncured synthetic-resin layer; and curing the uncured synthetic-resin layer.

8 Claims, 12 Drawing Sheets

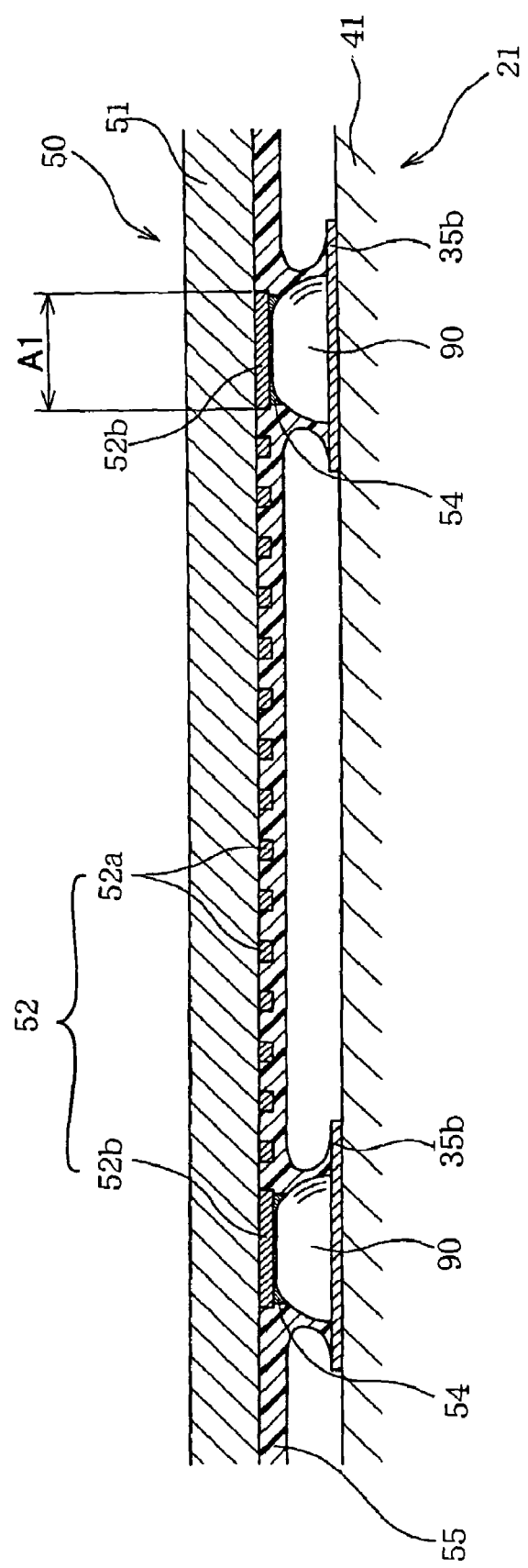

RECORDING HEAD UNIT AND METHOD OF PRODUCING THE SAME

The present application is based-on Japanese Patent Application No. 2004-126380 filed on Apr. 22, 2004, the contents of which are incorporated herein by reference.

BACKGROUND OF THE INVENTION

1. Field of the Invention

The present invention relates in general to a recording head unit and a method of producing the recording head unit.

2. Discussion of Related Art

A recording head of a recording head unit generally includes an actuator unit having a plurality of individual electrodes which are provided to correspond respectively to a plurality of recording elements. The actuator unit is arranged such that, when an operating signal is supplied to selected one or ones of the plurality of individual electrodes, one or ones of the plurality of recording elements corresponding to the selected one or ones of the individual electrodes is/are operated to perform recording of suitable images, characters, etc., on a recording medium. As one example of such an actuator unit, a piezoelectric actuator is disclosed in U.S. Patent Application Publication No. 2003/0112298 A1 corresponding to JP-A-2003-69103 (FIGS. 2 and 3, in particular), for instance. The piezoelectric actuator includes a plurality of tabular piezoelectric elements and a plurality of individual electrodes (signal electrodes) which respectively correspond to the plurality of piezoelectric elements.

One example of such a piezoelectric actuator is shown in FIG. 12. In the piezoelectric actuator generally indicated at 100 in FIG. 12, a flexible printed wiring board 103 is electrically connected to a plurality of individual electrodes 102 formed on a surface of each piezoelectric element of the actuator. Since the flexible printed wiring board may be referred to as a flexible printed circuit, the flexible printed wiring board 103 is referred to as "FPC 103" in the following description. The FPC 103 has a three-layer structure consisting of a base film 104; a plurality of conductive leads 105 which respectively correspond to the plurality of individual electrodes 102 and each of which includes a wire portion 105a and a terminal portion 105b (electric bonding pad); and a cover coat 106 having an electric insulating property and covering the conductive leads 105. The plurality of conductive leads 105 constitute a wiring pattern. Portions of the cover coat 106 corresponding to the terminal portions 105b are partially removed, so that the terminal portions 105a are exposed to an outside, and a bump 107 is formed on the exposed portion of each terminal portion 105b. Each bump 107 includes a core 107a which is formed of a metal such as Ni and which protrudes toward the corresponding individual electrode 102, and a bonding agent 107b such as solder to cover the core 107a. For joining the piezoelectric actuator 100 and the FPC 103 to each other, with the bumps 107 held in contact with the respective individual electrodes 102 by pressing the bumps 107 onto the same 102, there is applied heat, pressure, or vibration to the contacting portions where the bumps 107 and the individual electrodes 102 are respectively held in contact with one another, thereby melting the bonding agents 107b. As a result, the terminal portions 105b of the FPC 103 and the individual electrodes 102 are electrically connected respectively to one another via the respective bumps 107.

SUMMARY OF THE INVENTION

In joining the piezoelectric actuator 100 and the FPC 103 to each other as described above, it is needed to form openings 106a by partially removing the cover coat 106 for exposing the terminal portions 105b of the conductive leads 105 to the outside. In this case, for connecting the individual electrodes 102 and the terminal portions 105b respectively to one another with high reliability, each of the terminal portions 105b needs to be formed to have a size larger than actually required by taking into account error in forming the openings 106a in the cover coat 106. Where a ratio of a total area of the terminal portions 105b with respect to an area of the entirety of the FPC 103 increases (an area of each terminal portion 105b is indicated by "A" in FIG. 12), however, a spacing pitch at which adjacent wire portions 105a of adjacent conductive leads 105 are spaced apart from each other is inevitably decreased, so that density of the conductive leads 105 constituting the wiring pattern (i.e., wiring density) is accordingly increased, undesirably pushing up a cost of manufacture of the FPC 103. Further, since there is a limit in densely forming the conductive leads 105 (the wire portions 105a), it may be difficult to form a required number of the conductive leads 105 (the wire portions 105a) on the FPC 103. In the meantime, for minimizing the area of each terminal portion 105b, each opening 106a needs to be formed in the cover coat 106 with very high accuracy, resulting in a cost increase of the FPC 103.

It is therefore a first object of the present invention to provide a method of producing a recording head unit which enables an actuator unit and a printed wiring board to be electrically connected to each other at a low cost with high reliability. It is a second object of the invention to provide a recording head unit in which an actuator unit and a printed wiring board are electrically connected to each other at a low cost with high reliability.

The above-indicated first object of the present invention may be achieved according to a first aspect of the invention, which provides a method of producing a recording head unit comprising: (A) a recording head including: a plurality of recording elements; and an actuator unit including a plurality of individual electrodes which respectively correspond to the plurality of recording elements; and (B) a printed wiring board which includes conductive leads respectively having terminal portions, which is electrically connected to the plurality of individual electrodes, and through which an operating signal for operating the plurality of recording elements is supplied to the plurality of individual electrodes, the method comprising: forming a plurality of conductive bumps on a surface of the actuator unit such that the plurality of conductive bumps protrude from the surface of the actuator unit, so as to be electrically connected to the plurality of individual electrodes, respectively; coating a surface of the printed wiring board with an uncured synthetic resin to form an uncured synthetic-resin layer covering the conductive leads of the printed wiring board; bringing the plurality of conductive bumps and the terminal portions of the conductive leads into contact with one another by pressing the plurality of conductive bumps onto the uncured synthetic-resin layer such that the plurality of conductive bumps penetrate the uncured synthetic-resin layer; and curing the uncured synthetic-resin layer.

In the method of producing a recording head unit according to the above-indicated first aspect of the invention, a plurality of conductive bumps are initially formed on the surface of the actuator unit such that the plurality of conductive bumps protrude from the surface of the actuator unit, so as to be electrically connected to the plurality of individual electrodes, respectively. (This step of forming the plurality of conductive bumps may be hereinafter referred to as a "first step" for the sake of convenience). In the meantime, the surface of the printed wiring board on which the conductive leads are formed is coated, by various methods such as printing, with an uncured synthetic resin having an electrical insulating property, thereby forming an uncured synthetic-resin layer covering the conductive leads. (This step of coating the surface of the printed wiring board with the uncured synthetic resin may be hereinafter referred to as a "second step" for the sake of convenience). Next, the plurality of conductive bumps provided on the actuator unit are brought into contact respectively with the terminal portions, by pressing the bumps onto the uncured synthetic-resin layer formed on the printed wiring board, such that the bumps penetrate the uncured synthetic-resin layer. (This step of bringing the plurality of bumps and the terminal portions into contact with one another may be hereinafter referred to as a "third step" for the sake of convenience). Finally, the uncured synthetic-resin layer is cured, thereby connecting the individual electrodes and the terminal portions respectively to one another via the respective bumps. (This step of curing the uncured synthetic-resin layer may be hereinafter referred to as a "fourth step" for the sake of convenience).

As described above with respect to "Discussion of the Related Art", the printed wiring board includes the conductive leads each of which has the wire portion and the terminal portion. In the above-described method according to the first aspect of the invention, the uncured synthetic-resin layer is provided on the printed wiring board by coating and thereafter the bumps provided on the actuator unit are pressed onto the uncured synthetic-resin layer such that the bumps penetrate the uncured synthetic-resin layer, whereby the bumps and the terminal portions can be easily brought into contact respectively with one another while keeping the conductive leads in an electrically insulated state by the synthetic-resin layer with high reliability. Therefore, the present method does not need a conventionally required step of forming, with high accuracy, the openings at portions of the cover coat corresponding to the terminal portions of the conductive leads for exposing the terminal portions to the outside, resulting in a reduction in the cost of manufacture of the printed wiring board. Because the bumps are provided on the actuator unit, the size of the terminal portions of the conductive leads formed on the printed wiring board can be made small, as long as the size of the terminal portions allows top end portions of the bumps to be brought into contact with the respective terminal portions with high reliability. According to the present method, therefore, the size of the terminal portions can be reduced, in contrast with the above-described conventional method (FIG. 12) in which the bumps are provided on the printed wiring board so as to have a size larger than actually required by taking into account the forming accuracy with which the openings are formed in the cover coat. The reduction in the size of the terminal portions results in a reduction in the wiring density. Further, in the third step, since the synthetic-resin layer is in an uncured state, the bumps can penetrate the uncured synthetic-resin layer even where the top end portions of the bumps are not acute or pointed, resulting in easy formation of the bumps.

The above-indicated second object of the present invention may be achieved according to a second aspect of the invention, which provides a recording head unit comprising: (A) a recording head including: a plurality of recording elements; and an actuator unit including a plurality of individual electrodes which respectively correspond to the plurality of recording elements; and (B) a printed wiring board which includes conductive leads respectively having terminal portions, which is electrically connected to the plurality of individual electrodes, and through which an operating signal for operating the plurality of recording elements is supplied to the plurality of individual electrodes. The recording head further comprises: a plurality of conductive bumps which are formed on a surface of the actuator unit such that the plurality of conductive bumps protrude from the surface of the actuator unit, so as to be electrically connected to the plurality of individual electrodes, respectively; and a synthetic-resin layer which is formed on a surface of the printed wiring board so as to cover the conductive leads thereof. The plurality of conductive bumps penetrate the synthetic-resin layer formed on the surface of the printed wiring board, so that the plurality of conductive bumps are electrically connected to the plurality of terminal portions of the conductive leads, respectively.

In the recording head unit constructed according to the above-indicated second aspect of the invention, the plurality of conductive bumps are provided on the actuator unit, whereby the size of the terminal portions of the respective conductive leads which constitute the wiring pattern of the printed wiring board can be reduced, enabling the wiring density of the printed wiring board to be made lower.

FORMS OF THE INVENTION

The present invention may be practiced in various forms. Each of the various forms will be described, together with the effect based on each form.

In the present method according to the above-indicated first aspect of the invention, the terminal portions and the individual electrodes may be electrically connected respectively to one another via the respective bumps by simply bringing the bumps and the terminal portions into contact with one another, respectively. In one preferred form of the above-indicated first aspect, the bumps and the terminal portions may be respectively bonded to one another before or after the uncured synthetic-resin layer is cured in the fourth step. In this instance, the reliability in the electrical connection between the bumps and the terminal portions can be improved.

In another preferred form of the present method according to the above-indicated first aspect of the invention, the method further comprises forming a Sn layer on a surface of each of the terminal portions before the surface of the printed wiring board is coated with the uncured synthetic resin in the second step. Where Ag or the like is included in the bumps, there are formed bonding layers including an Ag—Sn metal or the like at respective connected portions at which the bumps and the terminal portions are respectively connected to one another, thereby increasing the strength at the connected portions.

In still another preferred form of the present method according to the above-indicated first aspect of the invention, the third step (the step of bringing the plurality of conductive bumps and the terminal portions into contact with one another) is carried out such that the uncured synthetic resin reaches the surface of the actuator unit at a connected portion where each of the plurality of conductive bumps and each of the terminal portions are connected to each other, when the plurality of conductive bumps penetrate the uncured synthetic-resin layer by pressing the plurality of conductive bumps onto the uncured synthetic-resin layer. Where the uncured synthetic resin is cured in a state in which the uncured synthetic resin reaches the surface of the actuator unit, the bonding strength with which the bumps and the terminal portions are respectively bonded or connected to one another can be further increased.

In a further preferred form of the present method according to the above-indicated first aspect of the invention, the plurality of conductive bumps are formed of an adhesive which includes Ag and which has conductivity and a thermosetting property. Where the printed wiring board and the actuator unit are connected to each other by the bumps formed of the adhesive described above, it is possible to further increase the bonding strength between the bumps and the terminal portions.

In a still further preferred form of the present method according to the above-indicated first aspect of the invention, the recording head is an ink-jet head which comprises a flow-path unit including: a plurality of pressure chambers which respectively communicate with a plurality of nozzles from which ink is ejected; and a common ink chamber which communicates with the plurality of pressure chambers. The actuator unit includes: a piezoelectric sheet provided on the flow-path unit for changing a volume of each of the plurality of pressure chambers; and the plurality of individual electrodes formed on a surface of the piezoelectric sheet so as to respectively correspond to the plurality of pressure chambers. Each of the plurality of individual electrodes includes: a main portion formed on a region of the surface of the piezoelectric sheet which overlaps a corresponding one of the plurality of pressure chambers as viewed in a direction perpendicular to a plane of the piezoelectric sheet; and a land portion which is connected to the main portion and which is formed on a region of the surface of the piezoelectric sheet which does not overlap the corresponding one of the plurality of pressure chambers as viewed in the direction. The first step (the step of forming a plurality of conductive bumps) comprises forming each of the plurality of conductive bumps on a surface of each of the land portions.

In an ink-jet head arranged to eject ink from nozzles by deforming a piezoelectric sheet which is opposed to pressure chambers, in a case where each of the bumps is formed on a main portion of each of the individual electrodes, which main portion is formed on a region of the piezoelectric sheet that overlaps a corresponding one of the pressure chambers, a portion of the piezoelectric sheet opposing to that pressure chamber may be prevented from being deformed by the bump and the uncured synthetic resin adhering to the vicinity of that bump, causing a risk of unstable ink ejection. In the above-described preferred form of the present method, however, each of the bumps is formed on a land portion of each of the individual electrodes, which land portion is formed on a region of the piezoelectric sheet that does not overlap the corresponding one of the pressure chambers. Accordingly, there is no risk that the bump disturbs the deformation of the portion of the piezoelectric sheet opposing to the pressure chamber, assuring stable ink ejection.

In one preferred form of the above-indicated second aspect of the invention, the synthetic-resin layer continuously exists between the wiring board and the actuator at a connected portion where each of the plurality of conductive bumps and each of the terminal portions are connected to each other. In the thus constructed recording head unit, the strength with which the bumps and the terminal portions are bonded or connected respectively to one another can be increased, whereby the reliability in the electrical connection therebetween can be improved.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIGS. 8A and 8B are views showing an actuator unit, wherein FIG. 8A is a cross sectional view of the actuator unit and FIG. 8B is a plan view of an individual electrode of the actuator unit;

FIG. 9 is a cross sectional view taken along line 9-9 in FIG. 8;

FIGS. 10A and 10B are views for explaining a process of connecting the actuator unit and a FPC to each other, wherein FIG. 10A shows a state before connection of the actuator unit and the FPC and FIG. 10B shows a state after connection of the actuator unit and the FPC;

FIGS. 11A and 11B are views for explaining a process of connecting the actuator unit and the FPC to each other according to a modified embodiment of the invention, wherein FIG. 11A shows a state before connection of the actuator unit and the FPC and FIG. 11B shows a state after connection of the actuator unit and the FPC.

DETAILED DESCRIPTION OF THE PREFERRED EMBODIMENTS

Figure 1:
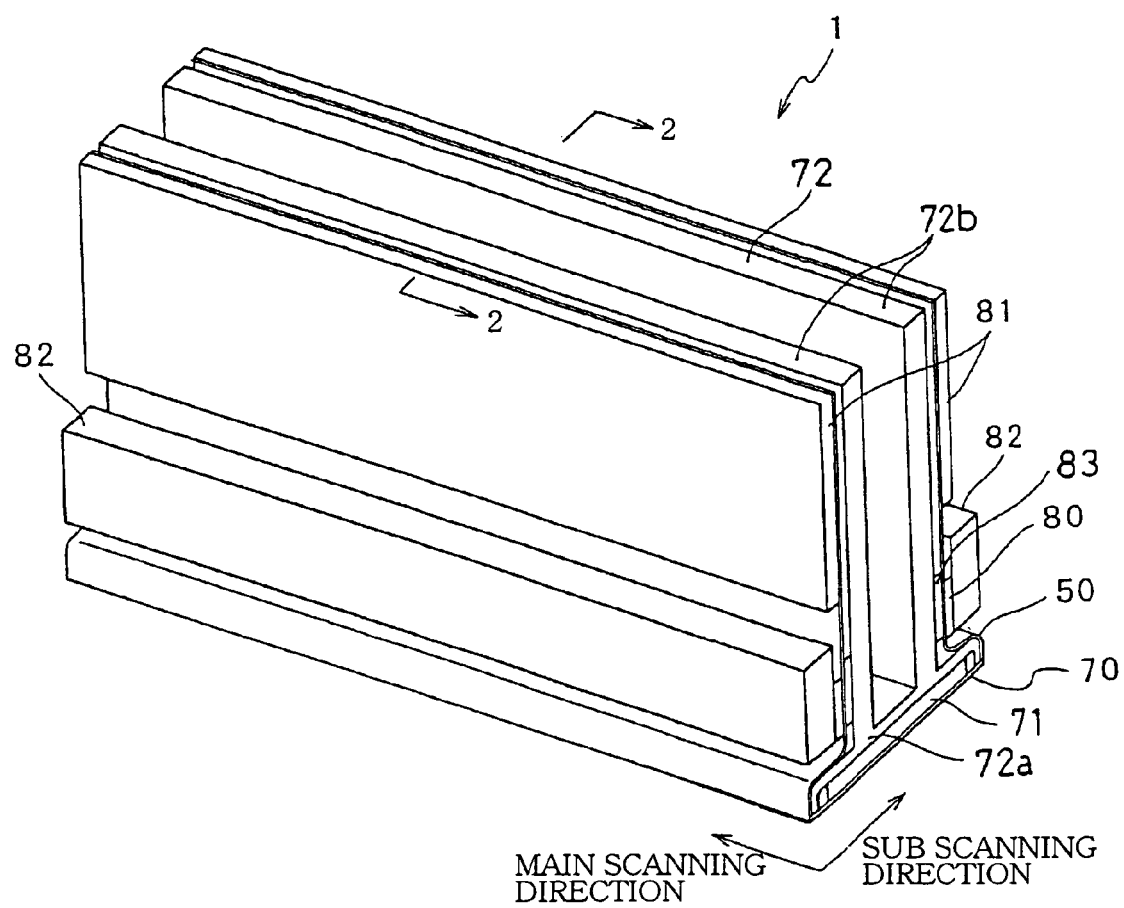
FIG. 1 is a perspective view showing an ink-jet head unit to which a principle of the present invention is applied.

There will be described one embodiment of the present invention referring to the drawings. In this embodiment, the principle of the invention is applied to an ink-jet head unit arranged to eject ink from nozzles toward a recording medium.

Figure 2:
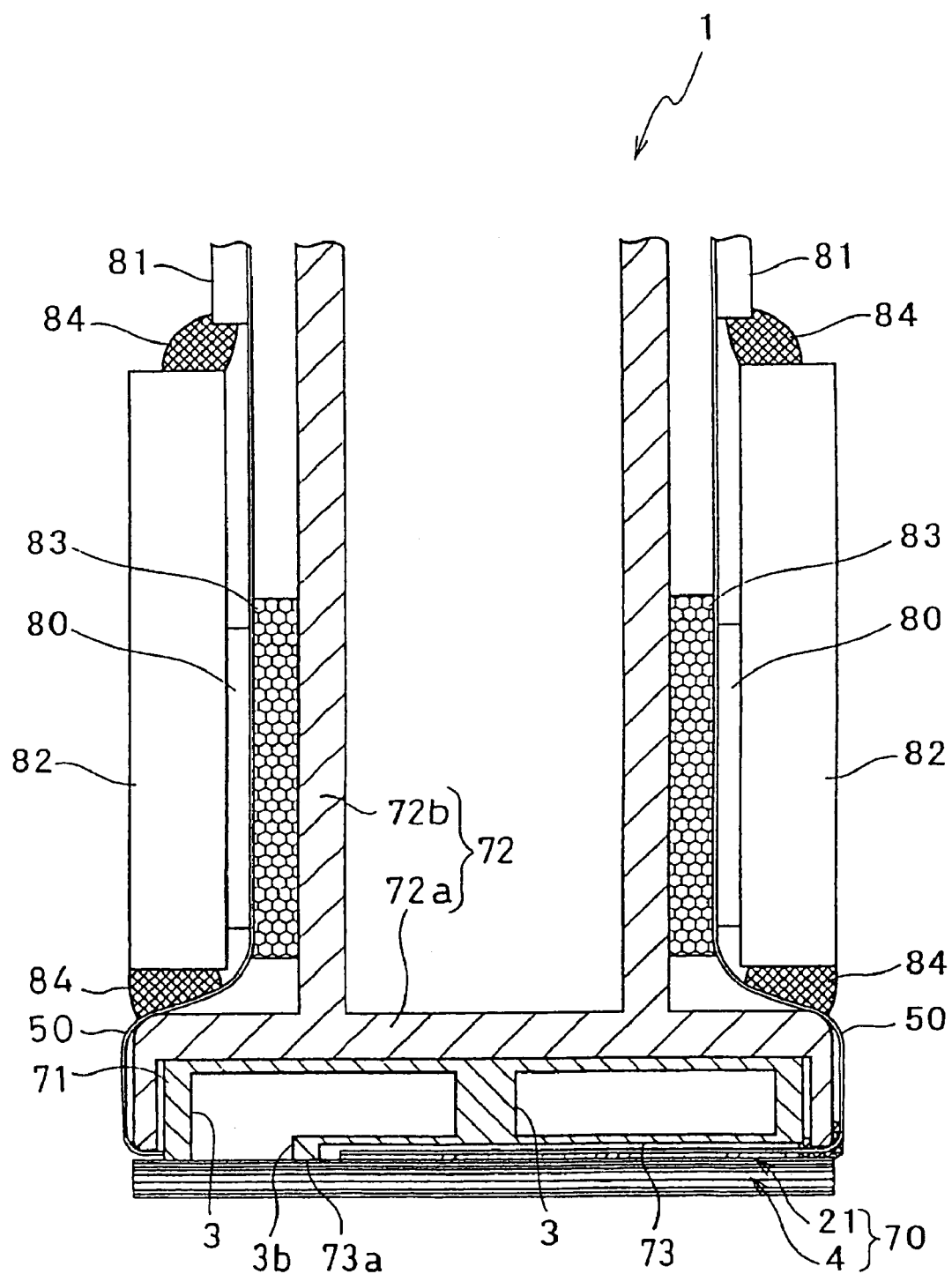
FIG. 2 is a cross sectional view taken along line 2-2 in FIG. 1.

As shown in FIGS. 1 and 2, an ink-jet head unit 1 as a recording head unit includes: an ink-jet head 70 as a recording head which has, in plan view, a rectangular shape extending in a main scanning direction and a plurality of nozzles 8 (FIGS. 4 and 5) through which ink is ejected toward a sheet of paper as a recording medium; and a base block 71 which is disposed above the ink-jet head 70 and in which are formed two ink reservoirs 3, 3 each functioning as a flow passage of ink to be supplied to the ink-jet head 70.

The ink-jet head 70 includes: a flow-path unit 4 in which ink paths are formed; and a plurality of actuator units 21 bonded to an upper surface of the flow-path unit 4. Each of the ink-flow path unit 4 and a plurality of actuator units 21 is formed such that a plurality of thin plates are stacked on and bonded to one another. A flexible printed wiring board 50 (hereinafter referred to as "FPC 50" as explained in the "Discussion of the Related Art") is bonded to upper surfaces of the actuator units 21 and drawn out to both sides. The base block 71 is formed of a metal such as stainless steel, for instance. Each of the ink reservoirs 3, 3 formed in the base block 71 is a substantially rectangular parallelepiped hollow region extending in a longitudinal direction of the base block 71.

As shown in FIG. 2, a lower surface 73 of the base block 71 protrudes downward at portions 73a thereof in the vicinity of openings 3b. The portions 73a may be hereinafter referred to as the "opening-vicinity portions 73a". (The openings 3b will be described.) The base block 71 is in contact with the flow-path unit 4 only at the opening-vicinity portions 73a of its lower surface 73. Thus, regions of the lower surface 73 of the base block 71 other than the opening-vicinity portions 73a are spaced apart from the ink-jet head 70, and the actuator units 21 are disposed within the space between the ink-jet head 70 and the lower surface 73 of the base block 71 at the above-indicated spaced regions thereof.

As shown in FIG. 2, the base block 71 is accommodated in a recess formed in a lower surface of a holding portion 72a of a holder 72 and is bonded and fixed to the holding portion 72a. The holder 72 includes the holding portion 72a and a pair of tabular projecting portions 72b extending from an upper surface of the holding portion 72a in an upward direction perpendicular to the upper surface, so as to be opposed to each other with a predetermined distance therebetween. The FPC 50 bonded to the actuator units 21 extends along the outer surface of each projecting portion 72b with an elastic member 83 such as a sponge interposed therebetween. The FPC 50 is connected to respective substrates 81 at respective end portions thereof. Driver ICs 80 are mounted on respective portions of the FPC 50 disposed on the surface of each projecting portion 72b of the holder 72. The FPC 50 is electrically connected to both of the driver ICs 80 and the actuator units 21 in order to transmit operating signals outputted from the driver ICs 80 to the actuator units 21 of the ink-jet head 70.

Heat sinks 82 each having a substantially rectangular parallelepiped shape are disposed to be in close contact with the respective driver ICs 80, whereby heat generated at the driver ICs 80 is dissipated through the heat sinks 82. Seal members 84 are respectively provided between the upper surfaces of the heat sinks 82 and the substrates 81 and between the lower surfaces of the heat sinks 82 and the FPC 50.

Figure 3:
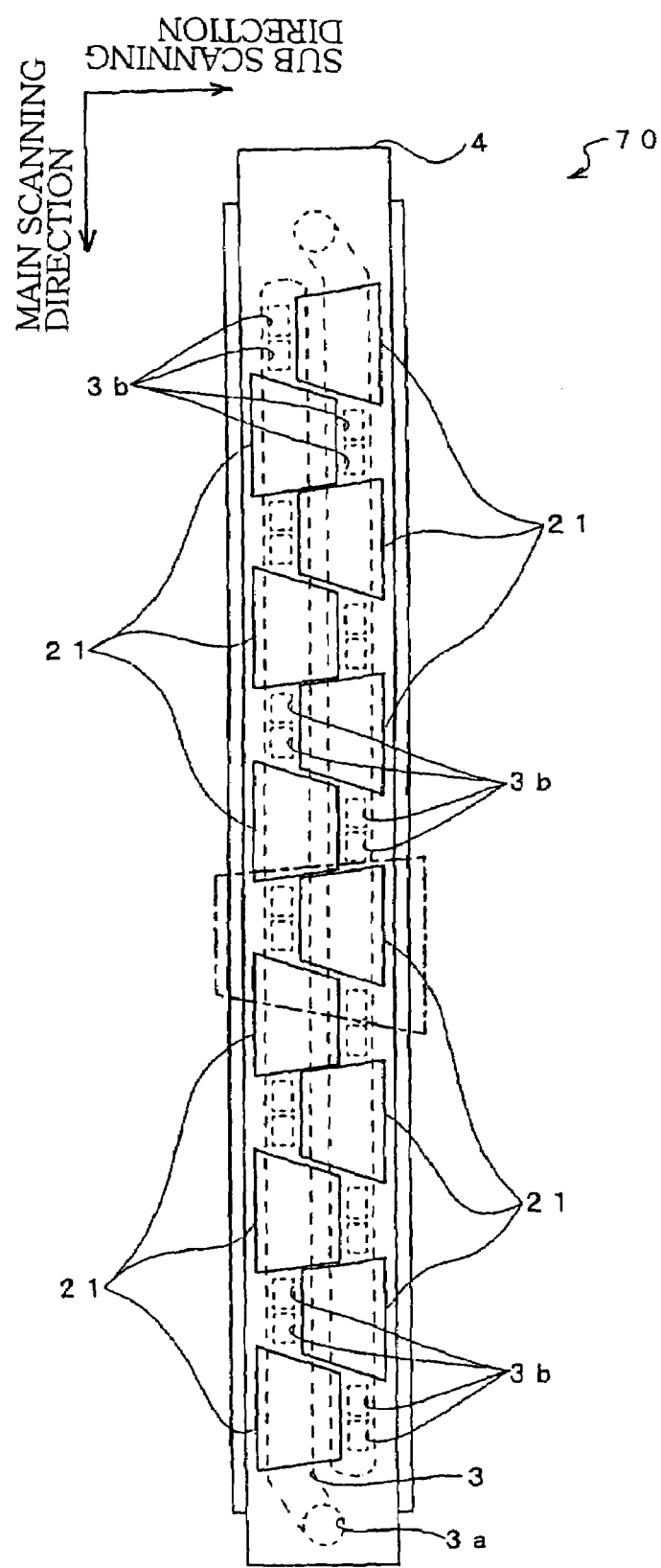
FIG. 3 is a plan view showing an ink-jet head of the ink-jet head unit of FIG. 1.

FIG. 3 is a plan view of the ink-jet head 70 shown in FIG. 1. In FIG. 3, each ink reservoir 3 formed in the base block 71 is virtually illustrated by broken line. The two ink reservoirs 3, 3 extend in a longitudinal direction of the ink-jet head 70 so as to be in parallel to each with a predetermined spacing therebetween. At one of opposite ends of each ink reservoir 3, there is formed an end opening 3a through which the ink reservoir 3 communicates with an ink tank (not shown) so as to be filled with ink. Each ink reservoir 3 is formed with a plurality of openings 3 which are formed to extend in the longitudinal direction of the ink-jet head 70. The ink reservoirs 3, 3 and the flow-path unit 4 are connected to each other through the openings 3. The openings 3b are formed in a plurality of pairs, and two openings 3b of each pair are disposed in close contact with each other in the longitudinal direction of the ink-jet head 70. The pairs of openings 3b communicating with one of the two ink reservoirs 3 and the pairs of openings 3b communicating with the other ink reservoir 3 are arranged in a zigzag pattern in plan view.

The actuator units 21 each having a trapezoidal shape in plan view are provided on regions of the upper surface of the flow-path unit 4 which do not correspond to the openings 3b, such that the actuator units 21 are arranged in a zigzag pattern opposite to that of the pairs of openings 3b. Parallel opposed sides (short and long sides) of each actuator unit 21 are parallel to the longitudinal direction of the ink-jet head 70, and oblique sides of adjacent actuator units 21 partially overlap as viewed in the main scanning direction.

Figure 4:
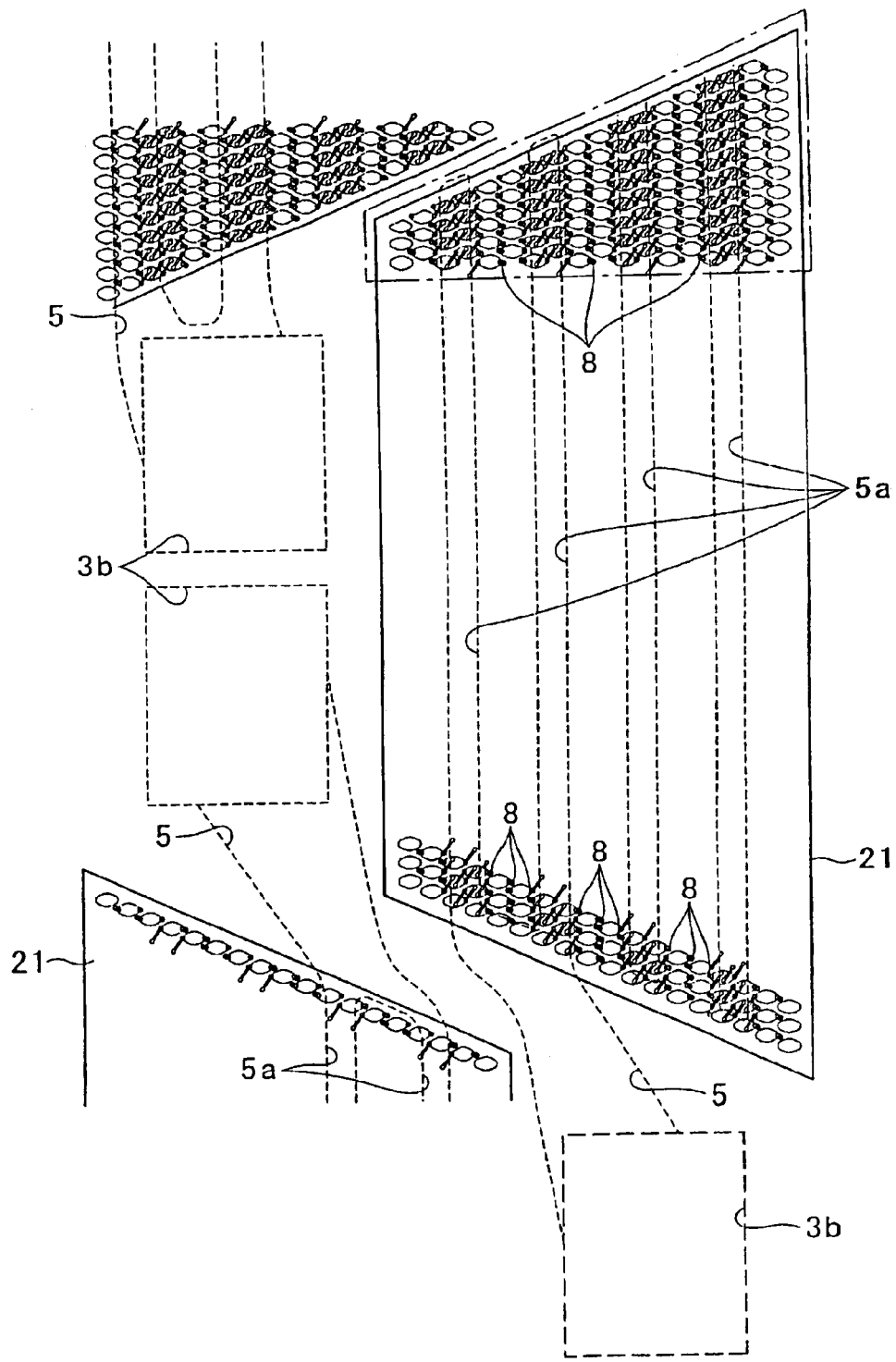
FIG. 4 is an enlarged view of an area enclosed with one-dot chain line in FIG. 3.

FIG. 4 is a view showing an area enclosed with one-dot chain line in FIG. 3. As shown in FIG. 4, the openings 3b provided for each of the ink reservoirs 3 communicate with respective manifolds 5. Each manifold 5 is branched into two sub manifolds 5a each as a common ink chamber. Two branched sub manifolds 5a extend from one of two openings 3a which are located on opposite sides of the two oblique sides of each actuator unit 21 and another two branched sub manifolds 5a extend from the other of the two openings 3a. Thus, in plan view, four sub manifolds 5a in total extend below each actuator unit 21 along the two parallel sides of the same 21 so as to be spaced apart from one another.

On the lower surface of the flow-path unit 4 which is opposite to the upper surface thereof to which the actuator units 21 are bonded, a plurality of ink ejection regions are formed so as to correspond to a plurality of bonding regions of the upper surface to which the actuator units 21 are respectively bonded. In each ink ejection region, a multiplicity of nozzles 8 are arranged in matrix as described below. While only some of the nozzles 8 are illustrated in FIG. 4 in the interest of brevity, the nozzles 8 are actually arranged all over each ink ejection region.

Figure 5:
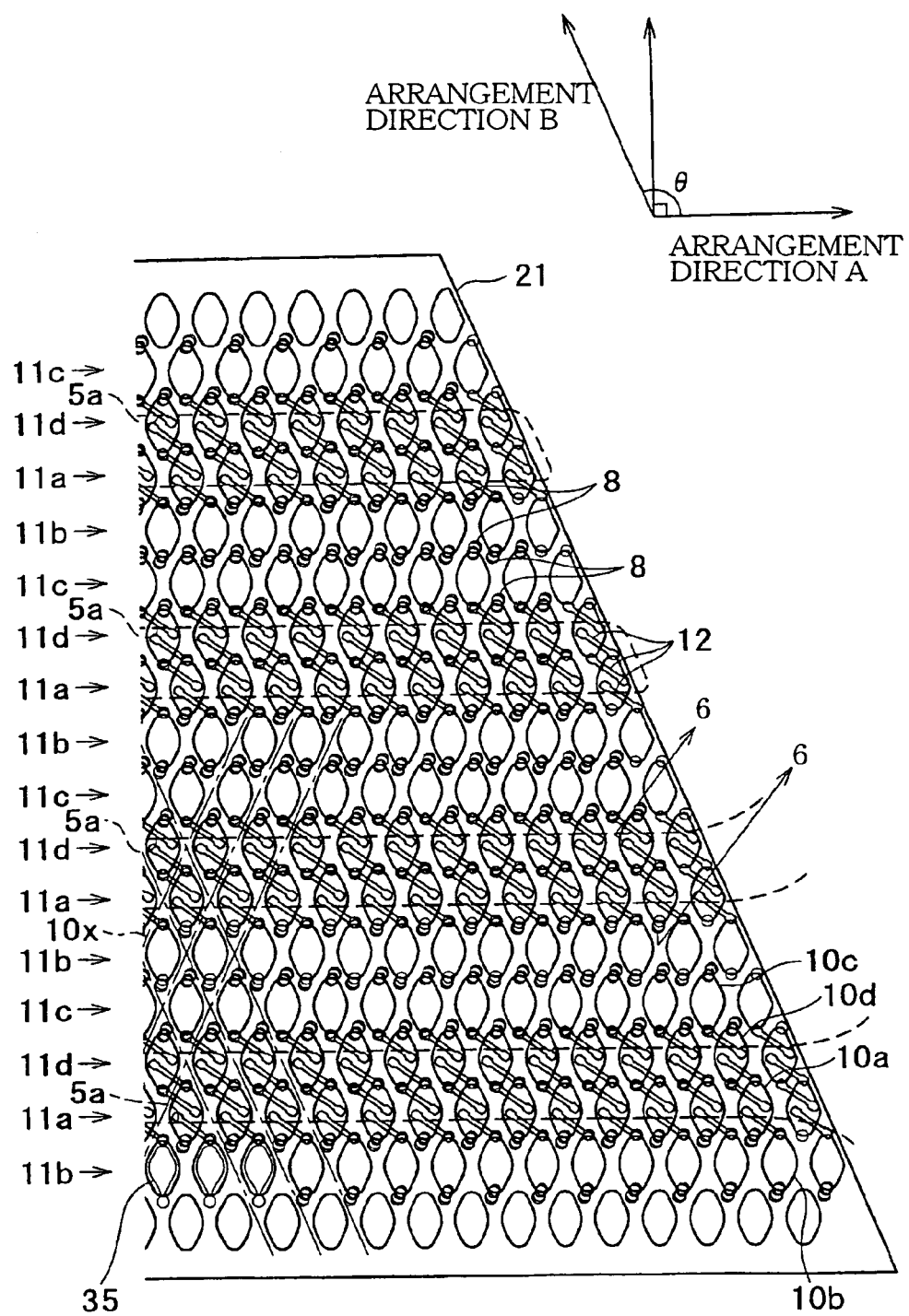
FIG. 5 is an enlarged view of an area enclosed with one-dot chain line in FIG. 4.
Figure 6:
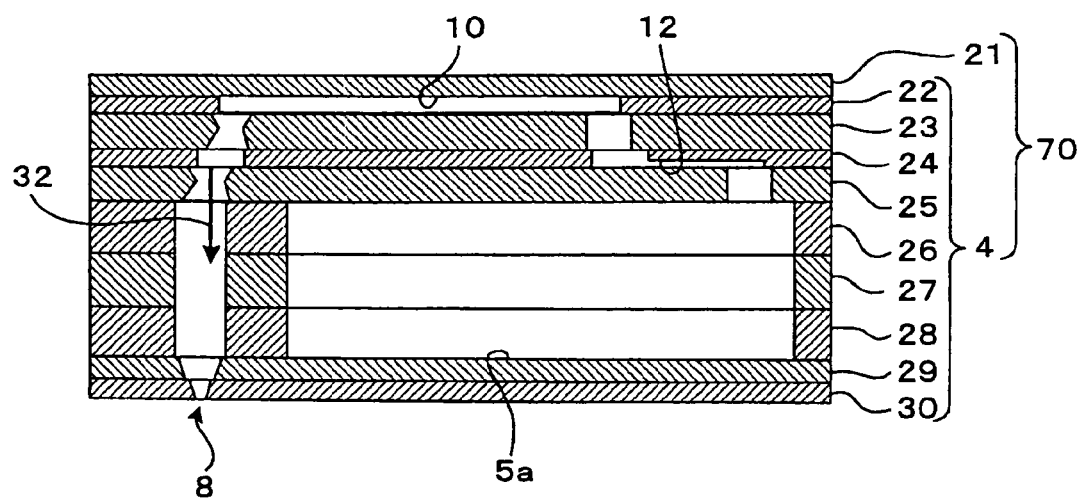
FIG. 6 is a cross sectional view taken along line 6-6 in FIG. 5.

FIG. 5 is an enlarged view of an area enclosed with one-dot chain line in FIG. 4. FIGS. 4 and 5 show a state wherein a plane on which a multiplicity of pressure chambers 10 of the flow-path unit 4 are arranged in matrix is viewed in a direction perpendicular to the ink ejection surface of the ink-jet head 70. Each of the pressure chambers 10 has, in plan view, a substantially rhombic shape having rounded corners. The long diagonal line of each rhombic pressure chamber 10 is parallel to a widthwise direction of the flow-path unit 4. As shown in FIG. 6, one end of each pressure chamber 10 communicates with a corresponding nozzle 8 and the other end thereof communicates, via a corresponding aperture 12, with a corresponding sub manifold 5a as a common ink passage. A plurality of individual electrodes 35 are formed on each actuator unit 21 at positions which overlap the respective pressure chambers 10 in plan view. Each individual electrode 35a has, in plan view, a shape which is similar to the shape of each pressure chamber 10 and whose size is slightly smaller than the size of the pressure chamber 10. For the sake of simplicity, only some of the individual electrodes 35 are illustrated in FIG. 5. Further, the pressure chambers 10, the apertures 12, etc., which are in the actuator units 21 or the flow-path unit 4 and which should be expressed by broken line are illustrated in solid line in FIGS. 4 and 5.

In FIG. 5, a plurality of imaginary rhombic areas 10x in which the respective pressure chambers 10 (10a, 10b, 10c, 10d) are accommodated are arranged adjacent to one another in matrix in two directions, i.e., an arrangement direction A and an arrangement direction B, such that adjacent rhombic areas 10x do not overlap with one another and have respective sides in common. The arrangement direction A is a longitudinal direction of the ink-jet head unit 1, i.e., a direction of extension of the sub manifolds 5a, and is parallel to a short diagonal line of each rhombic area 10x.

The arrangement direction B is a direction of one oblique side of each rhombic area 10x that forms an obtuse angle θ with respect to the arrangement direction A. The center position of each pressure chamber 10 is common to that of the corresponding rhombic area 10x and the contour line of each pressure chamber 10 is separated from that of the corresponding rhombic area 10x in plan view.

The pressure chambers 10 arranged adjacent to one another in matrix in the two arrangement directions A and B are spaced apart from each other by a distance corresponding to 37.5 dpi in the arrangement direction A. In the present embodiment, sixteen pressure chambers 10 are arranged in one row in the arrangement direction B in one ink ejection region. The pressure chambers 10 located at opposite ends in the arrangement direction B are dummy chambers that do not contribute to ink ejection.

The plurality of pressure chambers 10 formed in matrix constitute a plurality of pressure-chamber rows along the arrangement direction A, as shown in FIG. 5. The plurality of pressure-chamber rows are classified into a first pressure-chamber row 11a, a second pressure-chamber row 11b, a third pressure-chamber row 11c, and a fourth pressure-chamber row 11d in accordance with their positions relative to the sub manifolds 5a, as viewed in a direction perpendicular to the sheet surface of FIG. 5. Each of the first through fourth pressure-chamber rows 11a-11d are disposed periodically four times in order of 11c, 11d, 11a, 11b, 11c, 11d . . . 11b, from the short side of the parallel opposed sides of the actuator unit 21 toward the long side.

In the pressure chambers 10a constituting the first pressure-chamber row 11a and the pressure chambers 10b constituting the second pressure-chamber row 11b, the nozzles 8 are located at a lower end of each pressure chamber 10a, 10b nearer to the lower side of the sheet surface of FIG. 5, with respect to a vertical direction in FIG. 5 perpendicular to the arrangement direction A, as viewed in the direction perpendicular to the sheet surface of FIG. 5. Namely, the nozzles 8 of the pressure chambers 10a, 10b are located at respective lower ends of the corresponding rhombic areas 10x, as seen in the vertical direction in FIG. 5. On the other hand, in the pressure chambers 10c constituting the third pressure-chamber row 11c and the pressure chambers 10d constituting the fourth pressure-chamber row 11d, the nozzles 8 are located at an upper end of each pressure chamber 10c, 10d nearer to the upper side of the sheet surface of FIG. 5, with respect to the vertical direction in FIG. 5 perpendicular to the arrangement direction A, as viewed in the direction perpendicular to the sheet surface of FIG. 5. Namely, the nozzles 8 of the pressure chambers 10c, 10d are located at respective upper ends of the corresponding rhombic areas 10x, as seen in the vertical direction in FIG. 5. In the first and fourth pressure-chamber rows 11a, 11d, half or more of the region of each pressure chamber 10a, 10d overlaps the corresponding sub manifold 5a, as viewed in the direction perpendicular to the sheet surface of FIG. 5. In the second and third pressure-chamber rows 11b, 11c, the entire region of each pressure chamber 11c, 11d does not overlap any sub manifold 5a. Accordingly, the pressure chambers 10 belonging to any of the pressure-chamber rows 11a-11d can be formed such that the nozzles 8 communicating with the corresponding pressure chambers 10 do not overlap the sub manifolds 5a while making the width of the sub manifolds 5a as large as possible, whereby the ink-can be smoothly supplied to the pressure chambers 10.

Figure 7:
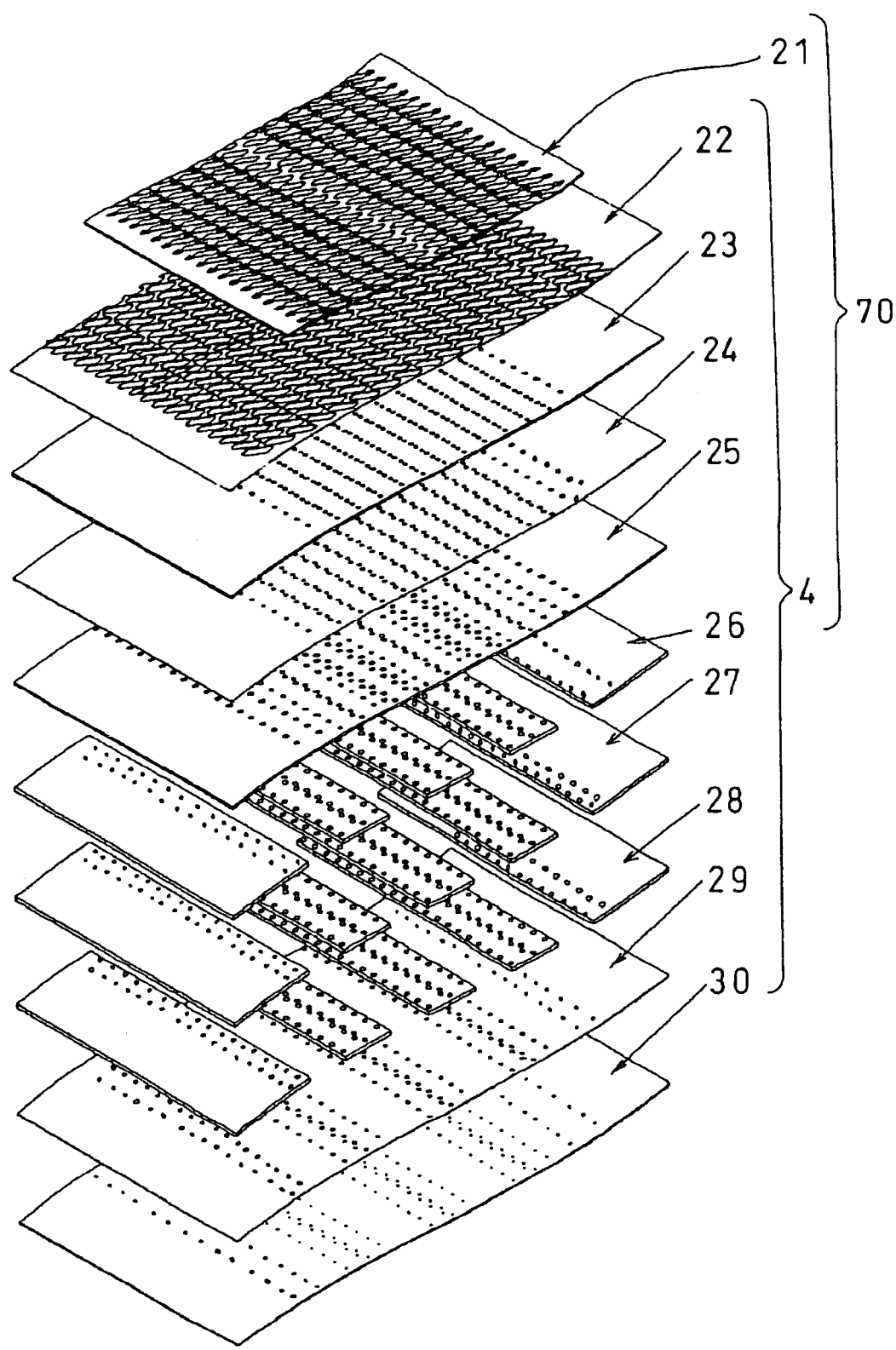
FIG. 7 is an exploded perspective view showing the ink-jet head.

Referring next to FIGS. 6 and 7, there will be explained a sectional structure of the ink-jet head 70. As shown in FIG. 6, each nozzle 8 communicates with the corresponding sub manifold 5a through the corresponding pressure chamber 10 and the corresponding aperture 12. Thus, in the ink-jet head 70, there is formed, for each pressure chamber 10, an individual ink path 32 extending from an outlet of the sub manifold 5a to the nozzle 8 through the aperture 12 and the pressure chamber 10.

As shown in FIG. 6, the pressure chambers 10 and the apertures 12 are provided at mutually different levels in a direction of stacking of the plurality of thin plates. According to this arrangement, in portions of the flow-path unit 4 corresponding the ink ejection regions located below the respective actuator units 21, an aperture 12 communicating with one pressure chamber 10 can be disposed so as to overlap, in plan view, another pressure chamber 10 which is adjacent to that one pressure chamber 10, as shown in FIG. 5. Consequently, since the pressure chambers 10 can be arranged at high density so as to be located close to one another, high-resolution image printing can be realized by the ink-jet head unit 1 with a relatively small area of the ink ejection regions.

As shown in FIG. 7, the ink-jet head 70 has a laminar structure in which ten plates in total are stacked or superposed on one another. The ten plates consist of a plate-like actuator unit 21, a cavity plate 22, a base plate 23, an aperture plate 24, a supply plate 25, manifold plates 26 27, 28, a cover plate 29, and a nozzle plate 30, which are arranged in order from the top of the ink-jet head 70. Among these ten plates, nine plates except the actuator unit 21 constitute the flow-path unit 4.

Each actuator unit 21 includes four piezoelectric sheets 41-44 (FIG. 8A) which are stacked on one another and is provided with electrodes, so that only an uppermost layer among the four piezoelectric sheets 41-44 serves as an active layer including active portions each of which becomes active at the time of application of an electric field (hereinafter may be simply referred to as "active layer including active portions", and the rest of three layers are non-active layers). The cavity plate 22 is a metal plate in which are formed a multiplicity of openings with a substantially rhombic shape in plan view that give the respective pressure chambers 10. The base plate 23 is a metal plate in which are formed, for one pressure chamber 10 of the cavity plate 22, a communication hole between the pressure chamber 10 and the corresponding aperture 12 and a communication hole between the pressure chamber 10 and the corresponding nozzle 8. The aperture plate 24 is a metal plate in which are formed, for one pressure chamber 10 of the cavity plate 22, the aperture 12 constituted by two holes and a half-etched part connecting the two holes, and a communication hole between the pressure chamber 10 and the corresponding nozzle 8. The supply plate 25 is a metal plate in which are formed, for one pressure chambers 10 of the cavity plate 22, a communication hole between the corresponding aperture 12 and the corresponding sub manifold 5a and a communication hole between the pressure chamber 10 and the corresponding nozzle 8. The manifold plates 26, 27, 28 are metal plates and have, for one pressure chamber 10, respective communication holes between the pressure chamber 10 and the corresponding nozzle 8, in addition to cutouts corresponding to the sub manifolds 5a. The cover plate 29 is a metal plate in which is formed, for one pressure chamber 10, a communication hole between the pressure chamber 10 and the corresponding nozzle 8. The nozzle plate 30 is a metal plate in which is formed, for one pressure chamber 10, a hole which gives the corresponding nozzle 8.

These ten plates 21-30 are stacked on one another while being positioned relative to one another so as to define the individual ink paths 32, as shown in FIG. 6. Each individual ink path 32 extends upward from the sub manifold 5a, then extends horizontally in the aperture 12, further extends upward, then again extends horizontally in the pressure chamber 10, extends slightly obliquely in a downward direction so as to be away from the aperture 12, and extends vertically downward toward the nozzle 8. A plurality of recording elements are formed such that each recording element includes the individual ink path 32, the nozzle 8, etc.

Figure 8A:
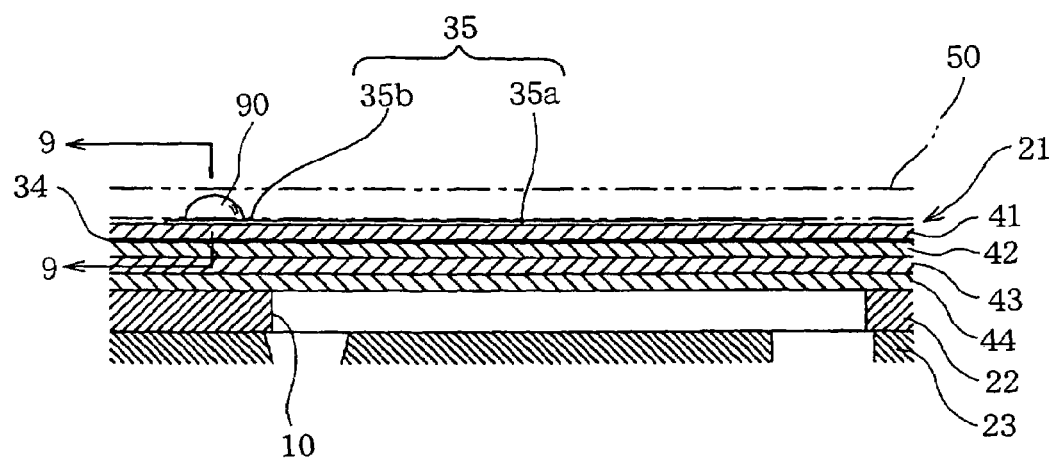
Figure 8B:
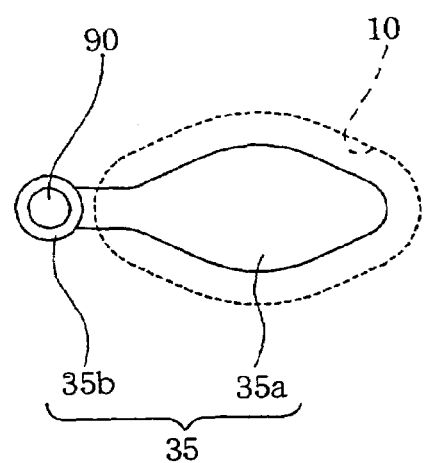

Next, there will be explained a structure of each actuator unit 21 superposed on the cavity plate 22 which is the uppermost plate of the flow-path unit 4. FIG. 8A is a partly enlarged cross sectional view showing the actuator unit 21 and the pressure chamber 10. FIG. 8B is a plan view of the individual electrode 35 formed on the actuator unit 21.

As shown in FIG. 8A, each actuator unit 21 includes the four piezoelectric sheets 41, 42, 43, 44 each having a thickness of about 15 µm. These piezoelectric sheets 41-44 are formed as a layered flat plate (consisting of continuous flat layers) which continuously extends over the multiplicity of pressure chambers 10 formed in one ink ejection region in the ink-jet head 70. Since the piezoelectric sheets 41-44 extend over the multiplicity of pressure chambers 10 as the continuous flat layers, the individual electrodes 35 (which will we described) can be disposed at high density on the piezoelectric sheet 41 by a screen printing technique, for instance. Further, the pressure chambers 10 formed at positions corresponding to the respective individual electrodes 35 can also be disposed at high density, whereby high-resolution image printing can be achieved. The piezoelectric sheets 41-44 are formed of a ceramic material of lead zirconate titanate (PZT) having ferroelectricity.

The individual electrodes 35 are formed on the uppermost piezoelectric sheet 41. Between the uppermost piezoelectric sheet 41 and the piezoelectric sheet 42 which underlies the uppermost piezoelectric sheet 41, a common electrode 34 having a thickness of substantially 2 µm is disposed to extend all over the surface of the sheets 41, 42. The individual electrodes 35 and the common electrode 34 are formed of an Ag—Pd based metal material, for instance.

Each individual electrode 35 is formed on the piezoelectric sheet 41 with a thickness of substantially 1 µm. As shown in FIG. 8B, the individual electrode 35 includes a main portion 35a having a substantially rhombic shape in plan view almost similar to that of the pressure chamber 10, and a land portion 35b which is connected to one acute-angled portion of the substantially rhombic main portion 35a and which has a circular shape in plan view having a diameter of about 160 µm. As shown in FIG. 8B, the main portion 35a of each individual electrode 35 is formed on a region of the surface of the piezoelectric sheet 41, which region overlaps the corresponding pressure chamber 10 in plan view, while the land portion 35b is formed on a region of the surface of the piezoelectric sheet 41, which region does not overlap the pressure chamber 10 in plan view. The land portion 35b is made of the Ag—Pd based metal material, for instance. On the surface of the land portion 35b of each individual electrode 35, there is formed a conductive bump 90 made of a metal material including Ag, such that the bump 90 protrudes upward from the surface of the land portion 35b. As explained below, the FPC 50 is electrically connected at terminal portions 52b (FIG. 9) of conductive leads 52 thereof to the individual electrodes 53 via the respective bumps 90. In the present embodiment, each bump 90 has a semi-spherical shape and a height of about 35 µm.

The common electrode 34 is grounded at a region not shown, and is kept at the ground potential equally in its area corresponding to all pressure chambers 10. The individual electrodes 35 are connected to the driver ICs 80 via the FPC 50 including the conductive leads 52 which are provided independently for the respective individual electrodes 35, such that the electric potential of the respective individual electrodes 35 corresponding to the respective pressure chambers 10 can be controlled independently of each other.

Next, the explanation will be made with respect to the FPC 50 which electrically connects the plurality of individual electrodes 35 of the actuator units 21 to the driver ICs 80.

As shown in FIG. 9, the FPC 50 includes a base member 51 made of a polyimide film, and a plurality of conductive leads 52 which is formed of a conductive metal material such as copper foil, on a lower surface of the base film 51. The plurality of conductive leads 52 constitute a wiring pattern for individually connecting the individual electrodes 35 to the driver ICs 80 (FIGS. 1 and 2). Each of the conductive leads 52 includes a wire portion 52a and the terminal portion 52b provided at one end of the wire portion 52a. The surface of each terminal portion 52b made of the copper foil is covered with a bonding agent 54 formed of a conductive brazing material (solder), for instance.

On the lower surface of the FPC 50, an electrical insulating synthetic-resin layer 55 is formed by coating the lower surface with a thermosetting resin such as an epoxy resin, so as to cover the conductive leads 52 including the terminal portions 52b. The plurality of bumps 90 respectively formed on the land portions 35b of the individual electrodes 35 penetrate the synthetic-resin layer 55, and the bumps 90 are bonded via the bonding agents 54 to the respective terminal portions 52b each of which is formed at one end of the corresponding wire portion 52a of the conductive lead 52. Namely, the conductive leads 52 of the FPC 50 and the individual electrodes 53 are electrically connected respectively to one another via the respective bumps 90. Further, the synthetic-resin layer 55 reaches the surface of the actuator unit 21 at each of connected portions at which the respective bumps 90 and the respective terminal portions 52b are connected to one another, such that the synthetic-resin layer 55 continuously exists between the FPC 50 and the actuator unit 21 at the connected portions, thereby assuring increased strength at the connected portions.

Next, there will be described an operation of the actuator unit 21. In each actuator unit 21, the uppermost piezoelectric sheet 41 is polarized in its thickness direction. That is, the actuator unit 21 is a so-called unimorph type in which the upper piezoelectric sheet 41 (distant from the pressure chambers 10) is the active layer having the active portions while the lower three piezoelectric sheets 42-44 (nearer to the pressure chambers 10) are non-active layers. Accordingly, when a predetermined positive or negative voltage is applied to any one of the individual electrodes 35, an electric-field-applied portion of the piezoelectric sheet 41 sandwiched by and between the individual electrode 35 and the common electrode 34 functions as the active portion and contracts or shrinks in a direction perpendicular to the polarization direction owing to longitudinal piezoelectric effect, where the electric field and the polarization are in the same direction. Thus, there is applied an operating signal to each recording element. On the other hand, since the piezoelectric sheets 42-44 are not influenced by the electric field, the sheets 42-44 do not contract by themselves. Thus, there is generated a difference in strain in the direction perpendicular to the polarization direction between the upper piezoelectric sheet 41 and the lower three piezoelectric sheets 42-44. Therefore, the entirety of the piezoelectric sheets 41-44 deform into a convex shape that protrudes toward the non-active side (unimorph deformation). In this instance, as shown in FIG. 8A, the lower surface of the integral body including the piezoelectric sheets 41-44 is fixed to the upper surface of partition walls defining the pressure chambers 10 in the cavity plate 22, so that the piezoelectric sheets 41-44 deform into a convex shape that protrudes toward the pressure chamber 10. Accordingly, the volume of the pressure chamber 10 corresponding to the voltage-applied individual electrode 35 is decreased to increase the pressure of the ink, whereby the ink is ejected from the corresponding nozzle 8. Thereafter, when the electric potential of the individual electrode 35 is returned to the same potential as the common electrode 34, the piezoelectric sheets 41-44 return to the original shape and the volume of the pressure chamber 10 is accordingly returned to the original value, so that the ink is sucked into the pressure chamber 10 from the manifold 5.

In another driving method, all of the individual electrodes 35 are set in advance to have an electric potential different from that of the common electrode 34. Every time when an ejection request is made, any one of the individual electrodes 35 in accordance with the ejection request is once set to have the same electric potential as that of the common electrode 34. Then, at a predetermined timing, the individual electrode 35 is again set to have the electric potential different from that of the common electrode 34. In this instance, since the piezoelectric sheets 41-44 return to the original shape at a timing when the individual electrode 35 is set to have the same electric potential as that of the common electrode 34, the volume of the pressure chamber 10 corresponding to the individual electrode 35 is increased as compared with that in the initial state (in which the electric potentials of the individual electrode 35 and the common electrode 34 are different from each other), so that the ink is sucked into the pressure chamber 10 form the manifold 5. Thereafter, the piezoelectric sheets 41-44 deform into a convex shape that protrudes toward the pressure chamber 10 at a timing when the individual electrode 35 is again set to have the electric potential different from that of the common electrode 34. As a result, the volume of the pressure chamber 10 is decreased to increase the pressure of the ink, so that the ink is ejected from the corresponding nozzle 8.

There will be next explained a method of producing the ink-jet head unit 1 as described above. Initially, the nine plates, i.e., the cavity plate 22, the base plate 23, the aperture plate 24, the supply plate 25, the manifold plates 26-28, the cover plate 29, and the nozzle plate 30, are stacked on and bonded to one another by an adhesive, such that those plates 22-30 cooperate with one another to define the individual ink paths 32. Thus, the flow-path unit 4 is fabricated.

Then, each actuator unit 21 is produced in the following manner: Initially, a ceramic powder of lead zirconate titanate (PZT), a binder, and a solvent are mixed, and the mixture is spread and dried on a resin film such as PET (polyethylene terephthalate), thereby forming green sheets which respectively give the piezoelectric sheets 41-44 and each of which has a relatively large size that permits formation of the corresponding piezoelectric sheet used for a plurality of actuator units 21.

On a surface of the green sheet that gives the piezoelectric sheet 41, a conductive paste is printed so as to form a plurality of individual electrodes 35. On a surface of the green sheet that gives the piezoelectric sheet 42, a conductive paste is printed so as to form the common electrode 34. The four green sheets which respectively give the four piezoelectric sheets 41-44 are formed into an integral body by applying pressure thereto in the direction of stacking. Thereafter, a plurality of pieces which respectively correspond to a plurality of actuator units 21 to be incorporated in one ink-jet head unit 1 are cut from the integral body in which the large-sized green sheets are stacked, and the cut pieces are sintered, thereby providing the actuator units 21. The thus formed actuator units 21 are bonded to the flow-path unit 4 via an adhesive applied to the surface of the flow-path unit 4 (the cavity plate 22)

Figure 10A:
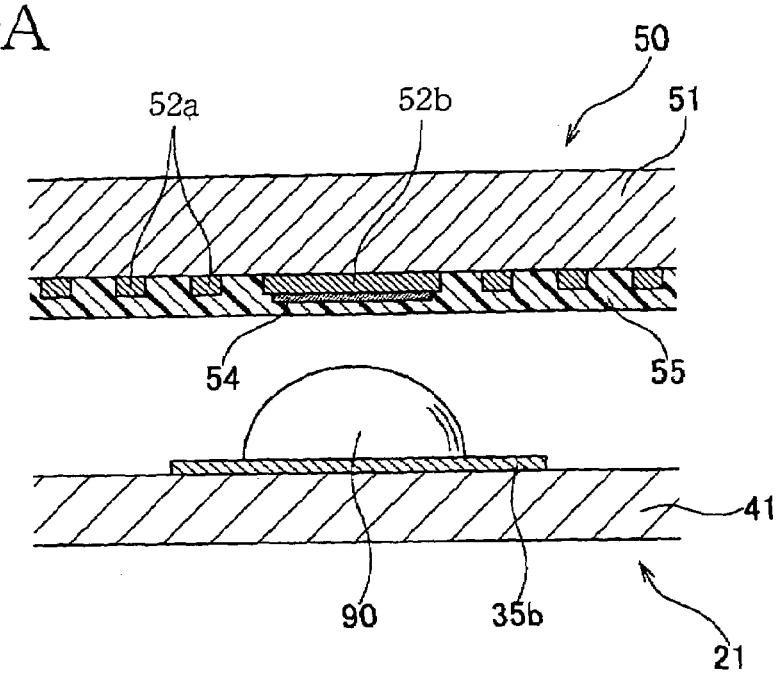

Subsequently, as shown in FIG. 10A, a plurality of bumps 90 each having a substantially semi-spherical convex shape are formed respectively on the plurality of land portions 35b of the individual electrodes 35 (the first step). Described more specifically, the upper surface of the piezoelectric sheet 41 is covered with a metal masking member having a multiplicity of openings respectively corresponding to the land portions 35b that are formed on respective regions of the upper surface of the piezoelectric sheet 41 which do not overlap the corresponding pressure chambers 10 in plan view. In this state, a conductive paste including Ag is printed, thereby forming the bumps 90 on the respective land portions 35b of the individual electrodes 35. Because the conductive paste used for forming the bumps 90 includes a polymer and is highly viscous, the bumps 90 which are relatively high and which have the semispherical convex shape can be formed.

In the meantime, after a layer of the bonding agent 54 composed of a conductive brazing material (solder) is formed on the surface of each terminal portion 52b of each conductive lead 52 of the FPC 50, the entirety of the lower surface of the FPC 50 is coated with an uncured thermosetting resin by printing, for instance, so as to form an uncured synthetic-resin layer 55 covering the entirety of the conductive leads 52 (the second step). In this instance, the synthetic-resin layer 55 is kept in an uncured state (a semi-hardened state) in which the synthetic-resin layer 55 does not drip from the FPC 50, by suitably adjusting various conditions such as temperature.

Figure 10B:
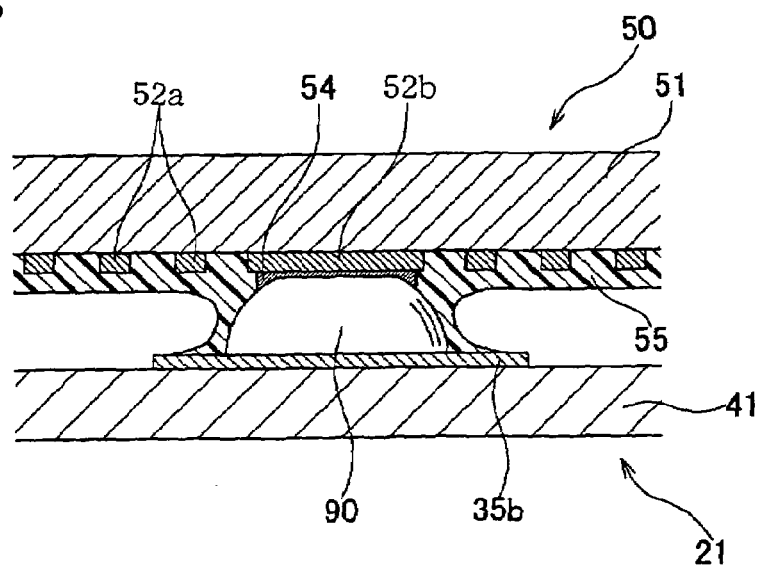

Next, as shown in FIG. 10B, the FPC 50 is pressed toward the piezoelectric sheet 41 with the bumps 90 and the terminal portions 52a of the conductive leads 52 of the FPC 50 positioned relative to one another, whereby the plurality of bumps 90 are pressed onto the uncured synthetic-resin layer 55 such that the bums 90 penetrate the synthetic resin layer 55. Thus, the top end portions of the plurality of bumps 90 and the bonding agents 54 formed on the surface of each terminal portions 52b are respectively brought into contact with one another (the third step). In this state, the surface of each bump 90 which is in contact with the corresponding terminal portion 52b via the bonding agent 54 is covered with the uncured synthetic resin. Since the synthetic-resin layer 55 is in the uncured state, the bumps 90 easily penetrate the same 55 even where the shape of the bumps 90 is the semi-spherical shape that is not acute or pointed. It is preferable that the uncured synthetic resin covering the surface of each bump 90 reaches the surface of each land portion 35b (the surface of the actuator unit 21) as shown in FIG. 10B when the bump 90 penetrates the synthetic-resin layer 55, by suitably determining conditions such as the thickness of the synthetic-resin layer 55, the degree of curing, etc.

In the present embodiment, the thickness of each conductive lead 52 is about 9 μm while the thickness of the synthetic-resin layer 55 covering the conductive leads 52 is about 15-20 μm. These thickness values permit the conductive leads 52 to be covered with the synthetic-resin layer 55 with high reliability and the uncured resin to reach the surface of each land portion 35b in a state in which the bumps 90 penetrate the synthetic-resin layer 55. Further, in the present embodiment, the synthetic-resin layer 55 is in the uncured state and therefore the bumps 90 are likely to penetrate the synthetic-resin layer 55 when the bumps 90 and the terminal portions 52b are brought into contact respectively with one another. In view of this, the bumps 90 are formed to have the substantially semi-spherical shape in the present embodiment. For assuring more reliable electric connection between the bumps 90 and the terminal portions 52b in a state in which the bumps 90 penetrate the synthetic-resin layer 55, it is preferable that each bump 90 has an acute or pointed shape at its top end portion.

Subsequently, the uncured synthetic-resin layer 55 given by the thermosetting resin is heated (at 150° C., for instance), to cure the synthetic-resin layer 55 (the fourth step). The heating operation is further carried out (at 240° C., for instance), thereby melting the bonding agents 54 to bond the respective bumps 90 and the respective terminal portion 52b to one another by the respective bonding agents 54. Thus, the synthetic-resin layer 55 covering the bumps 90 is cured and the bumps 90 and the terminal portions 52b are respectively bonded to one another by the bonding agents 54, thereby increasing the strength by which the respective terminal portions 52b of the FPC 50 and the respective bumps 90 provided on the individual electrodes 35 are bonded. Further, where the uncured synthetic resin covering the surfaces of the bumps 90 reaches the surfaces of the land portions 35b of the individual electrodes 35 as explained above, the bonding strength between the terminal portions 52b of the FPC 50 and the bumps 90 provided on the individual electrodes 35 can be further increased, assuring improved reliability in the electrical connection therebetween. Moreover, since the synthetic-resin layer 55 covers the bumps 90 so as to enclose the contact portions at which the bums 90 and the terminal portions 52b are respectively held in contact with one another, whereby the bonding agents 54 formed on the respective terminal portions 52b do not contact adjacent conductive leads 52 even when the bonding agents 54 are molten, sufficiently assuring the electrical insulation with respect to the conductive leads 52.

Figure 12:
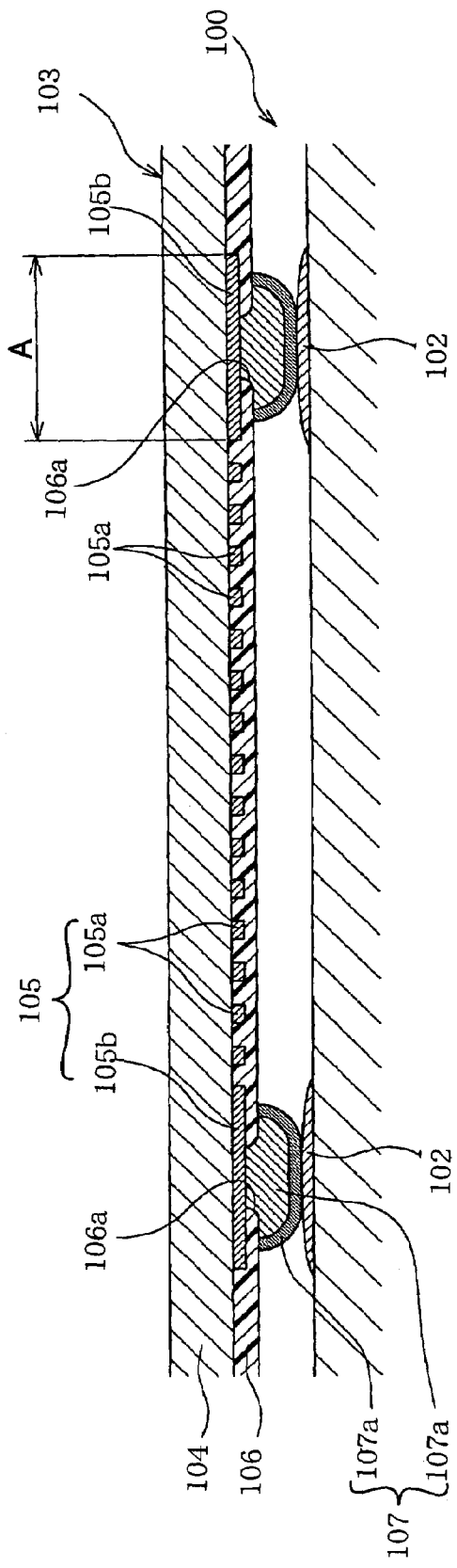
FIG. 12 is a cross sectional view showing connected portions between a piezoelectric actuator and a FPC in a conventional arrangement.

In the method of producing the ink-jet head unit 1 explained as described above, the uncured synthetic-resin layer 55 is formed on the FPC 50 by coating and thereafter the bumps 90 provided on the actuator unit 21 are pressed onto the synthetic-resin layer 55 such that the bumps 90 penetrate the same 55, whereby the bumps 90 and the terminal portions 52b can be easily brought into contact with one another while keeping the conductive leads 52 in an electrically insulated state with high reliability, owing to the synthetic-resin layer 55. Accordingly, the present method does not require the cover coat for insulation provided on the FPC in the conventional method shown in FIG. 12 and eliminates the conventionally required step of forming, with high accuracy, the openings at portions of the cover coat corresponding to the terminal portions for exposing the terminal portions to the outside, resulting in reduction in the cost of manufacture of the FPC 50. Moreover, because the bumps 90 are provided on the actuator unit 21, the size of the terminal portions 52b (indicated by "A1" in FIG. 9) of the conductive leads 52 formed on the FPC 50 can be made small, as long as the size of the terminal portions 52b allows the top end portions of the bumps 90 to be brought into contact with the respective terminal portions 52b with high reliability. According to the present method, therefore, the size of the terminal portions 52b can be reduced, in contrast with the conventional method (FIG. 12) in which the bumps are provided on the FPC so as to have a size larger than actually required by taking into account the forming accuracy with which the openings are formed in the cover coat. Accordingly, the reduction in the size of the terminal portions 52b results in reduction in the wiring density of the FPC 50. Further, because the bumps 90 are pressed onto the synthetic-resin layer 55 in the uncured state, the top end portions of the bumps 90 need not be formed into an acute or pointed shape for penetration thereof into the synthetic-resin layer 55, resulting in easy formation of the bumps 90.

As explained above, the bumps 90 electrically connecting the respective terminal portions 52b of the FPC 50 and the respective individual electrodes 35 to one another are provided not on the main portions 35a of the individual electrodes 35 formed on the regions of the upper surface of the piezoelectric sheet 41, which regions overlap the pressure chambers 10 in plan view, but on the land portions 35b of the individual electrodes 35 formed on the regions of the upper surface of the piezoelectric sheet 41, which regions do not overlap the pressure chambers 10 in plan view. According to this arrangement, the deformation of portions of the piezoelectric sheets 41-44 opposing to the pressure chambers 10 are not disturbed when the operating signal is inputted from the driver ICs 80 to the land portions 35b via the FPC 50 and the bumps 90, even in a state in which the uncured thermosetting resin and the bonding agents 54 molten at the time of connection of the bumps 90 and terminal portions 52b adhere to the surfaces of the land portions 35b. Therefore, the ink can be ejected with high stability.

It is to be understood that the present invention may be embodied with various changes and modifications, which may occur to those skilled in the art, without departing from the spirit and scope of the invention.

Some modified embodiments will be described. In the following modified embodiments, the same reference numerals as used in the illustrated embodiment are used to identify the corresponding components, and a detailed explanation of which is dispensed with.

In the illustrated embodiment, the bumps 90 and the terminal portions 52b are respectively bonded to one another by melting the bonding agents 54 after the thermosetting resin has been cured. Instead the uncured synthetic-resin layer 55 may be cured after the bumps 90 and the terminal portions 52b have been respectively bonded to one another by melting the bonding agents 54, by suitably employing other thermosetting resins having curing temperature values different from that of the thermosetting resin used in the illustrated embodiment or suitably employing other bonding agents having melting temperature values different from that of the bonding agent used in the illustrated embodiment.

Where the bumps 90 and the terminal portions 52b are respectively bonded to one another by using the bonding agents 54 as in the illustrated embodiment, it is possible to assure a relatively high degree of bonding strength between the bumps 90 and the terminal portions 52b owing to the bonding agents 54. In view of this, it is not necessarily required that the synthetic-resin layer 55 continuously exists between the FPC 50 and the actuator unit 21 at connected portions at which the bumps 90 and the terminal portions 52b are respectively connected to one another so as to reach the land portions 35b, i.e., the surface of the actuator unit 21, at the connected portions. In other words, the synthetic-resin layer 55 may be cured with the surfaces of the bumps 90 being only partially covered with the synthetic-resin layer 55.

The bumps 90 and the terminal portions 52b are not necessarily bonded to one another. The electrical connection between the bumps 90 and the terminal portions 52b may be accomplished by curing the synthetic-resin layer 55 with the bumps 90 and the terminal portions 52b being simply held in contact with one another. In this instance, oxidization preventing layers made of Au, for instance, may be provided on the surfaces of the respective terminal portion 52b for preventing the reliability in the electric connection between the terminal portions 52b and the bumps 90 from being lowered due to oxide films which may be formed on the surfaces of the terminal portions 52b made of the copper foil or the like. Where the bumps 90 and the terminal portions 52b are not bonded to one another by the bonding agents, it is preferable that the uncured synthetic-resin layer 55 reaches the land portions 35b, i.e., the surface of the actuator unit 21, at the connected portions of the bumps 90 and the terminal portions 52b, so that the synthetic-resin layer 55 continuously exists between the FPC 50 and the actuator unit 21 at the connected portions as shown in FIG. 10B, for increasing the connecting strength between the respective bumps 90 and the respective terminal portions 52b.

Figure 11A:
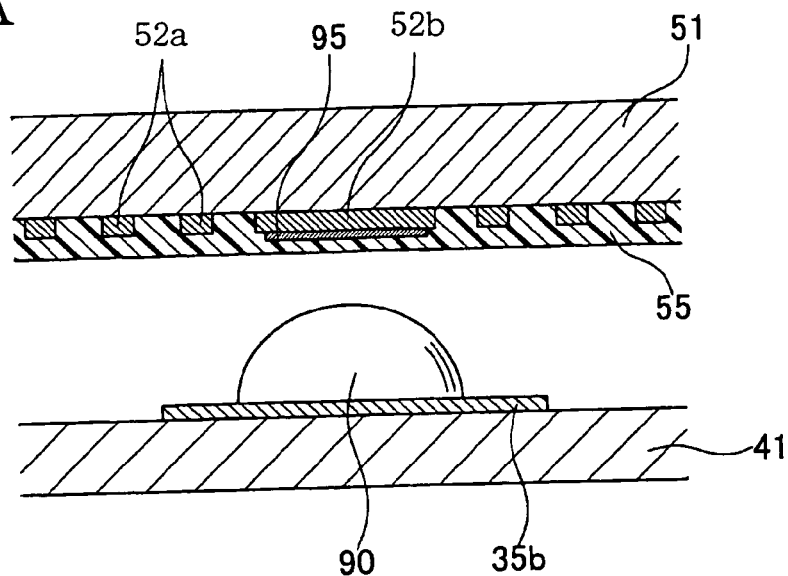
Figure 11B:
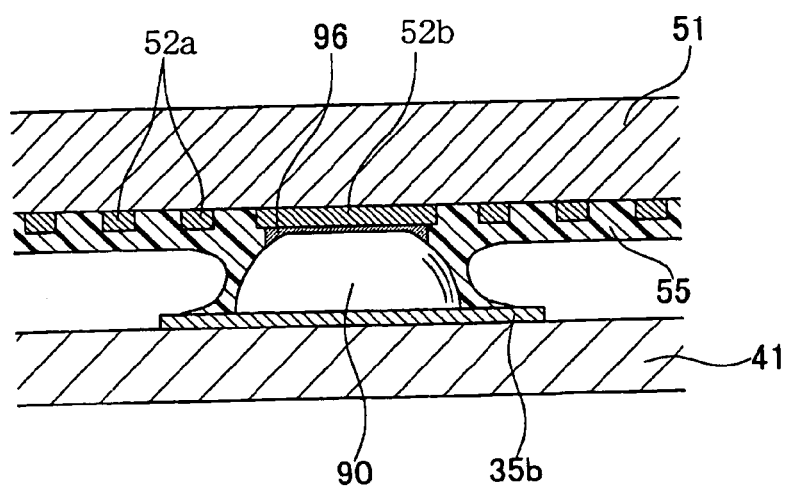

As shown in FIG. 11A, there may formed a Sn layer 95 on the entire surface of each terminal portion 52b, or on at least a part of the terminal portion 52b which contacts the bump 90, and each bump 90 including Ag and each Sn layer 95 may be heated at a temperature elevated to a predetermined level while they are held in contact with each other, whereby a bonding layer 96 including an Ag—Sn metal may be formed between the bump 90 and the terminal portion 52b, as shown in FIG. 11B. The temperature at which the Ag—Sn metal starts to melt is about 230° C. Accordingly, the temperature in the bonding operation is set at 240° C., for instance, thereby forming the bonding layers 96. This arrangement increases the connecting strength between the respective terminal portions 52b and the respective bumps 90, thereby improving the reliability in the electrical connection therebetween.

The plurality of bumps may be formed of an adhesive which includes Ag and which has conductivity and a thermosetting property. Where the bumps are formed of the adhesive described above, the bumps are brought into contact with the terminal portions 52b such that the bumps in a semi-cured or semi-hardened state penetrate the synthetic-resin layer 55. Thereafter, the bumps are cured by heating, whereby the terminal portions 52b of the FPC 50 and the land portions 35b of the individual electrodes 35 are respectively bonded to one another via the respective bumps, further improving the reliability in the electrical connection between the FPC 50 and the individual electrodes 35.

In the illustrated embodiment, the pieces corresponding to the actuator units 21 to be incorporated in one ink-jet head unit 1 are cut from the integral body in which the large-sized green sheets are stacked on one another. After the cut pieces have been sintered, the bumps 90 are printed on the respective surfaces of the land portions 35b of the individual electrodes 35. Instead the bumps 90 may be printed on the respective surfaces of the land portions 35b before cutting the integral body of the stacked green sheets into the pieces.

In addition to the thermosetting resin such as the epoxy resin used in the illustrated embodiment, there may be employed, as the uncured synthetic resin to be used in the present invention, various kinds of synthetic resin such as a UV curable resin which is cured by being irradiated with a UV ray.

In the illustrated embodiment, the principle of the invention is applied to a case where the FPC 50 having flexibility is connected to the actuator units 21. The principle of the invention is equally applicable to a case where a printed wiring board without flexibility is connected to the actuator units 21.

The principle of the invention is applicable to various types of recording heads such as those used for a thermal printer, a dot printer, and the like, other than the ink-jet head.

What is claimed is:

1. A method of producing a recording head unit comprising: (A) a recording head including: a plurality of recording elements; and an actuator unit including a plurality of individual electrodes which respectively correspond to the plurality of recording elements; and (B) a printed wiring board which includes conductive leads respectively having terminal portions, which is electrically connected to the plurality of individual electrodes, and through which an operating signal for operating the plurality of recording elements is supplied to the plurality of individual electrodes, the method comprising:

forming a plurality of conductive bumps on a surface of the actuator unit such that the plurality of conductive bumps protrude from the surface of the actuator unit, so as to be electrically connected to the plurality of individual electrodes, respectively;

coating a surface of the printed wiring board with an uncured synthetic resin to form an uncured synthetic-resin layer covering the conductive leads of the printed wiring board;

bringing the plurality of conductive bumps and the terminal portions of the conductive leads into contact with one another by pressing the plurality of conductive bumps onto the uncured synthetic-resin layer such that the plurality of conductive bumps penetrate the uncured synthetic-resin layer; and curing the uncured synthetic-resin layer.

2. The method according to claim 1, further comprising bonding the plurality of conductive bumps and the terminal portions respectively to one another before the curing the uncured synthetic-resin layer.

3. The method according to claim 1, further comprising bonding the plurality of conductive bumps and the terminal portions respectively to one another after the curing the uncured synthetic-resin layer.

4. The method according to claim 1, further comprising forming a Sn layer on a surface of each of the terminal portions before the coating a surface of the printed wiring board with an uncured synthetic resin.

5. The method according to claim 1, wherein the bringing the plurality of conductive bumps and the terminal portions of the conductive leads into contact with one another is carried out such that the uncured synthetic resin reaches the surface of the actuator unit at a connected portion where each of the plurality of conductive bumps and each of the terminal portions are connected to each other, when the plurality of conductive bumps penetrate the uncured synthetic-resin layer by pressing the plurality of conductive bumps onto the uncured synthetic-resin layer.

6. The method according to claim 1, wherein the plurality of conductive bumps are formed of an adhesive which includes Ag and which has conductivity and a thermosetting property.

7. The method according to claim 1,
wherein the recording head is an ink-jet head which comprises a flow-path unit including:
a plurality of pressure chambers which respectively communicate with a plurality of nozzles from which ink is ejected; and a common ink chamber which communicates with the plurality of pressure chambers,
  wherein the actuator unit includes: a piezoelectric sheet provided on the flow-path unit for changing a volume of each of the plurality of pressure chambers; and the plurality of individual electrodes formed on a surface of the piezoelectric sheet so as to respectively correspond to the plurality of pressure chambers,
  wherein each of the plurality of individual electrodes includes: a main portion formed on a region of the surface of the piezoelectric sheet which overlaps a corresponding one of the plurality of pressure chambers as viewed in a direction perpendicular to a plane of the piezoelectric sheet; and a land portion which is connected to the main portion and which is formed on a region of the surface of the piezoelectric sheet which does not overlap the corresponding one of the plurality of pressure chambers as viewed in the direction, and
  wherein the forming a plurality of conductive bumps comprises forming each of the plurality of conductive bumps on a surface of each of the land portions.

8. A recording head unit comprising: (A) a recording head including: a plurality of recording elements; and an actuator unit including a plurality of individual electrodes which respectively correspond to the plurality of recording elements; and (B) a printed wiring board which includes conductive leads respectively having terminal portions, which is electrically connected to the plurality of individual electrodes, and through which an operating signal for operating the plurality of recording elements is supplied to the plurality of individual electrodes,
  the recording head unit further comprising: a plurality of conductive bumps which are formed on a surface of the actuator unit such that the plurality of conductive bumps protrude from the surface of the actuator unit, so as to be electrically connected to the plurality of individual electrodes, respectively; and a synthetic-resin layer which is formed on a surface of the printed wiring board so as to cover the conductive leads thereof;
  wherein the plurality of conductive bumps penetrate the synthetic-resin layer formed on the surface of the printed wiring board, so that the plurality of conductive bumps are electrically connected to the plurality of terminal portions of the conductive leads, respectively, and
  wherein, at a connected portion where each of the plurality of conductive bumps and each of the terminal portions are connected to each other, the synthetic-resin layer extends toward and reaches the actuator unit so as to cover said each of the plurality of conductive bumps.

* * * * *